United States Patent
Helbig et al.

(10) Patent No.: US 9,016,352 B2
(45) Date of Patent: Apr. 28, 2015

(54) APPARATUS AND METHODS FOR COOLING REJECTED HEAT FROM SERVER RACKS

(71) Applicants: Joerg Burkhard Helbig, Ontario, NY (US); Steven Thomas Gizzi, Webster, NY (US)

(72) Inventors: Joerg Burkhard Helbig, Ontario, NY (US); Steven Thomas Gizzi, Webster, NY (US)

(73) Assignee: Calvary Applied Technologies, LLC, Webster, NY (US)

( * ) Notice: Subject to any disclaimer, the term of this patent is extended or adjusted under 35 U.S.C. 154(b) by 0 days.

(21) Appl. No.: 13/709,522

(22) Filed: Dec. 10, 2012

(65) Prior Publication Data

US 2013/0306269 A1 Nov. 21, 2013

Related U.S. Application Data

(60) Provisional application No. 61/649,577, filed on May 21, 2012.

(51) Int. Cl.
| | | |
|---|---|---|
| *F28F 9/00* | (2006.01) | |
| *H05K 7/20* | (2006.01) | |
| *H05K 5/00* | (2006.01) | |
| *F28F 9/007* | (2006.01) | |

(52) U.S. Cl.
CPC ............. *F28F 9/007* (2013.01); *Y10T 29/4935* (2015.01); *H05K 7/20781* (2013.01)

(58) Field of Classification Search
USPC ........... 165/67, 122, 55, 104.34, 77; 361/724, 361/726, 727, 695; 454/184; 312/272; 49/501, 505
See application file for complete search history.

(56) References Cited

U.S. PATENT DOCUMENTS

| | | | |
|---|---|---|---|
| 4,106,630 A | * | 8/1978 | Rosenband .................... 211/191 |
| 4,895,203 A | | 1/1990 | McLaren |
| 4,924,677 A | | 5/1990 | Quack |
| 5,184,879 A | | 2/1993 | Brossardt et al. |
| 5,462,110 A | | 10/1995 | Sarver |
| 5,471,850 A | | 12/1995 | Cowans |
| 5,676,197 A | | 10/1997 | Diebold et al. |
| 5,701,751 A | | 12/1997 | Flores |
| 5,740,018 A | | 4/1998 | Rumbut, Jr. |
| 5,823,006 A | | 10/1998 | Jung |
| 5,943,211 A | | 8/1999 | Havey et al. |
| 5,974,902 A | | 11/1999 | Scofield |
| 6,067,223 A | | 5/2000 | Diebel et al. |
| 6,134,109 A | | 10/2000 | Muller et al. |
| 6,154,368 A | | 11/2000 | Scofield |

(Continued)

FOREIGN PATENT DOCUMENTS

| | | |
|---|---|---|
| DE | 20000715 | 5/2000 |
| DE | 20008411 | 7/2000 |
| FR | 2623047 | 5/1989 |

OTHER PUBLICATIONS

Alcatel-Lucent et al., Advanced Refrigerant-bsed Cooling Technologies for Information and Communications Infrastructure (ARCTIC), Jul. 21, 2009.

(Continued)

*Primary Examiner* — John K. Ford
*Assistant Examiner* — Jon T Schermerhorn
(74) *Attorney, Agent, or Firm* — Woods Oviatt Gilman LLP; Katherine H. McGuire, Esq.

(57) ABSTRACT

The present invention is directed to apparatus and methods for cooling computer servers and/or electrical equipment in a rack device for data centers or telecommunication centers.

12 Claims, 8 Drawing Sheets

(56) References Cited

U.S. PATENT DOCUMENTS

| | | | |
|---|---|---|---|
| 6,359,782 B1 | 3/2002 | Scofield | |
| 6,443,010 B1 | 9/2002 | Scofield | |
| 6,446,449 B2 | 9/2002 | Krauter | |
| 6,591,896 B1 | 7/2003 | Hansen | |
| 6,628,520 B2 | 9/2003 | Patel et al. | |
| 6,643,123 B2 * | 11/2003 | Hartel et al. | 361/678 |
| 6,690,578 B2 | 2/2004 | Edelmann | |
| 6,734,801 B2 | 5/2004 | Scofield | |
| 6,772,604 B2 | 8/2004 | Bash | |
| 6,798,660 B2 | 9/2004 | Moss et al. | |
| 6,819,563 B1 | 11/2004 | Chu et al. | |
| 6,986,382 B2 | 1/2006 | Upadhya | |
| 7,003,966 B2 | 2/2006 | Sharma et al. | |
| 7,012,807 B2 | 3/2006 | Chu et al. | |
| 7,057,893 B2 | 6/2006 | Nicolai et al. | |
| 7,074,123 B2 | 7/2006 | Bettridge et al. | |
| 7,076,964 B2 | 7/2006 | Sakakibara | |
| 7,086,247 B2 | 8/2006 | Campbell et al. | |
| 7,106,590 B2 | 9/2006 | Chu et al. | |
| 7,184,269 B2 | 2/2007 | Campbell et al. | |
| 7,273,088 B2 | 9/2007 | Malone | |
| 7,312,995 B2 | 12/2007 | Wilson et al. | |
| 7,367,384 B2 | 5/2008 | Madara et al. | |
| 7,385,810 B2 | 6/2008 | Chu et al. | |
| 7,428,151 B2 | 9/2008 | Sonnabend et al. | |
| 7,437,887 B2 | 10/2008 | Hinder et al. | |
| 7,466,549 B2 | 12/2008 | Dorrich et al. | |
| 7,525,207 B2 | 4/2009 | Clidaras | |
| 7,539,020 B2 | 5/2009 | Chow et al. | |
| 7,559,209 B2 | 7/2009 | Nicolai et al. | |
| 7,614,247 B2 | 11/2009 | Nicolai et al. | |
| 7,635,020 B2 | 12/2009 | Hartel et al. | |
| 7,637,118 B2 | 12/2009 | Nicolai et al. | |
| 7,697,285 B2 * | 4/2010 | Donowho et al. | 361/690 |
| 7,707,712 B2 | 5/2010 | Kim | |
| 7,830,657 B2 | 11/2010 | Chu et al. | |
| 7,878,889 B2 | 2/2011 | Day | |
| 7,881,057 B2 | 2/2011 | Fink et al. | |
| 7,900,468 B2 | 3/2011 | Spearing | |
| 7,905,105 B2 | 3/2011 | Fair et al. | |
| 7,963,118 B2 | 6/2011 | Porter et al. | |
| 8,145,363 B2 | 3/2012 | Bean, Jr. et al. | |
| 8,261,565 B2 | 9/2012 | Borror | |
| 2002/0134528 A1 | 9/2002 | Sterner | |
| 2002/0176226 A1 | 11/2002 | Richardson et al. | |
| 2004/0070942 A1 | 4/2004 | Tomioka et al. | |
| 2005/0120737 A1 | 6/2005 | Borror et al. | |
| 2005/0213306 A1 | 9/2005 | Vos et al. | |
| 2005/0230068 A1 * | 10/2005 | Green et al. | 160/371 |
| 2006/0232945 A1 | 10/2006 | Chu et al. | |
| 2007/0128053 A1 | 6/2007 | Stamper | |
| 2007/0151707 A1 | 7/2007 | Lyons et al. | |
| 2007/0152507 A1 | 7/2007 | Lazzarato et al. | |
| 2007/0283716 A1 | 12/2007 | Marsala | |
| 2008/0198549 A1 | 8/2008 | Rasmussen et al. | |
| 2008/0232069 A1 * | 9/2008 | Chu et al. | 361/724 |
| 2008/0266726 A1 | 10/2008 | Murakami et al. | |
| 2009/0046430 A1 | 2/2009 | Brewer et al. | |
| 2009/0086434 A1 | 4/2009 | Hodes et al. | |
| 2009/0168345 A1 * | 7/2009 | Martini | 361/691 |
| 2009/0173473 A1 | 7/2009 | Day | |
| 2009/0225514 A1 * | 9/2009 | Correa et al. | 361/701 |
| 2009/0301114 A1 | 12/2009 | Rowley et al. | |
| 2009/0308579 A1 | 12/2009 | Johnson et al. | |
| 2010/0033931 A1 * | 2/2010 | Miyazawa et al. | 361/696 |
| 2010/0165572 A1 | 7/2010 | Fink et al. | |
| 2010/0230079 A1 | 9/2010 | Byers et al. | |
| 2010/0300648 A1 * | 12/2010 | Grantham | 165/55 |
| 2010/0300650 A1 | 12/2010 | Bean, Jr. | |
| 2010/0305775 A1 | 12/2010 | Bean, Jr. et al. | |
| 2010/0328885 A1 * | 12/2010 | Scofield et al. | 361/695 |
| 2011/0085300 A1 * | 4/2011 | Sivanandan et al. | 361/694 |
| 2011/0247780 A1 | 10/2011 | Scofield | |
| 2011/0250831 A1 * | 10/2011 | Huang et al. | 454/184 |

OTHER PUBLICATIONS

Scofield Bill, Alcatel-Lucent Modular Cooling Solution Tests results for operation without fans on pumped, two-pahse modular cooling system, Technology White Paper.

Scofield Bill, Keeping Cool in the Data Center, A High-Efficiency Modular Solution, Strategic White Paper.

Scofield Bill, Alcatel-Lucent Modular Cooling Solution Pumped two-phase modular cooling humidity variation test results, Technology White Paper.

Scofield Bill, Alcatel-Lucent Modular Cooling Solution Redundancy test results for pumped, two-phase modular cooling system, Technology White Paper.

Patterson Michael K. et al., The State of Data Center Cooling, White Paper.

Derby Stephen et al., Patent Cooperation Treaty International Search Report for International Application No. PCT/US2011/047051; Aug. 9, 2011 filing date.

Liebert Corporation, Patent Cooperation Treaty International Search Report for International Application No. PCT/US2005/040745; Nov. 10, 2005 filing date.

Scofield Bill, Alcatel-Lucent Modular Cooling Solution Test Results for Operation with Extended Length Flex Hoses, Technology White Paper.

* cited by examiner

APPARATUS AND METHODS FOR COOLING REJECTED HEAT FROM SERVER RACKS

BACKGROUND OF THE INVENTION

The present invention generally relates to apparatus and methods for cooling electronic devices. More particularly, the present invention relates to apparatus and methods for cooling heated air emanating from electronic equipment to prevent overheating thereof.

It is generally well known that electronic devices such as computers generate heat when they are running, and that the device can be damaged should the temperature of the device be allowed to rise above a certain threshold. It is therefore important to ensure the device has a way of dissipating the generated heat so as to prevent overheating thereof.

Many of today's industries and businesses require a host of computer servers and electrical equipment that are located in what is referred to as a server room or telecommunication equipment room. Individual servers or other electronic devices may be arranged in a server rack which typically comprises a frame having a plurality of shelves arranged in vertically spaced relationship with each server or other electronic device positioned upon a respective shelf. The shelves are vertically spaced from each other to allow air to circulate between each server in a rack.

Manufacturers of the servers or other electronic devices make the housing with openings allowing air to travel through the device. In this way, heated air generated from the electronic components located within the housing is allowed to escape through the openings in the housing. Some electronic device manufacturers incorporate fans near the housing openings to actively draw the heated air out of the housing. Other heat management strategies may be utilized on or adjacent the housing such as fins or the like which act as heat sinks to help dissipate heat from the device.

The problem of electronic device heat management becomes more troublesome and acute when dealing with very large dedicated server rooms or rooms with high density equipment which generate significant amounts of heat. In these settings, auxiliary heat management tactics are required such as using evaporator/condenser type air conditioning units to cool the air within the server room. Such air conditioning units are referred to in the industry as "CRAC" units, which stands for "Computer Room Air Conditioning". While CRAC units may do the job of keeping the servers at a safe operating temperature, they are not very efficient in that they require a lot of electricity to keep the entire volume of the server room air cool. Maintaining the air in a large server room cool can thus be a significant, ongoing cost which can increase exponentially as more server racks are added to the room, rack densities are increased and/or the room size is expanded. For industries such as telecommunication companies which require server rooms the size of football fields, the operational costs of running CRAC units becomes financially unworkable and alternative, cheaper cooling strategies are necessary.

In response to the need for more efficient cooling strategies, cooling units and assemblies have been proposed which are placed in close proximity to the individual servers. In this strategy, the heated air being ejected from the device housing is cooled prior to it being allowed to mix with the ambient air in the room. Examples of such units and assemblies may be seen in the following patents:

U.S. Pat. No. 7,380,657 issued to Chu et al on Nov. 9, 2010
U.S. Pat. No. 7,905,105 issued to Fair et al on Mar. 15, 2011
U.S. Pat. No. 7,385,810 issued to Chu et al on Jun. 10, 2008

While the prior art has provided various apparatus and approaches for cooling server racks and server rooms, a need remains for a server rack/room cooling solution which is robust and reliably operates with little to no chance of harming the electronic components should a coolant leak from the cooling lines, has improved operating efficiency over prior art systems, and is readily customizable to a variety of loaded server rack configurations and heat loads. The present invention provides apparatus and methods which successfully addresses the above performance objectives.

SUMMARY OF THE INVENTION

Server racks generally comprise a tall, rectangular metal frame having vertically spaced shelves with the rack being open at the front and back. A series of racks are typically positioned in side-by-side relation in spaced rows. The rack open front provides access to the front of the servers while the open back provides access to the back of the servers. As explained above, server housings include openings allowing air to pass therethrough to assist with extracting heat from the server.

The present invention provides in a first aspect thereof a cooling door adapted to be removably mounted to the rear opening of a server rack. Although the preferred embodiment is a hinged door, it is understood that the word "door" as used herein is to be broadly interpreted to mean any type of connection so long as the door may be moved between a substantially closed and open positions relative to the server rack. Even further, the door may instead be free standing or attached by any means to a separate frame or the like that may be positioned next to but is not necessarily connected to the server rack (e.g., a frame on lockable caster wheels that may be rolled adjacent the rack).

The cooling door includes a protective cooling door cover preferably formed of sheet metal having air openings which may take the form of open area hexagonal holes and/or screen-type walls allowing unrestricted air flow therethrough. The door cover is preferably connected to the server rack via a hinged connection allowing the cooling door to pivot between open and closed positions. In the open position, the server rack rear opening is accessible to service or otherwise handle the servers on the rack shelves as needed. In the closed position, the cooling door cover extends across substantially the entire height and width of the rack rear opening.

A rectangular heat exchanger mounting frame is provided having first and second side frame members with a top frame member and bottom frame member extending therebetween to define a rectangular opening. The heat exchanger mounting frame is mounted between the door cover and the rear opening of the server rack. In a preferred embodiment, the mounting frame connects to the door cover in the proximity of the door cover hinges such that the loaded frame weight is not carried by the door cover but rather is supported at or adjacent to the location of the door hinge axis. Separating the mounting frame weight load from the major surface area of the door cover minimizes physical load stress on the cooling door cover which has beneficial effects such as reducing door cover wear and vibrations, for example. A separate hinge stiffening bar may be provided to extend along the length of the hinged edge of the door cover and to which the mounting frame may directly attach which provides further cooling door strength and stability.

At least one heat exchanger module is provided for removable attachment to the heat exchanger mounting frame. In a preferred embodiment, each heat exchanger module is first mounted to a respective tray which in turn is mounted to the heat exchanger mounting frame. The tray includes an array of fan openings in which a respective fan or, if no fan is required at a particular tray opening location, a cover may be removably mounted. The fans operate to help increase the CFM (cubic feet per minute) by drawing and direct air from the servers through the heat exchangers to cool it, maximizing the heat exchanger's capacity and then directing the cooled air through the openings in the door cover and into the server room.

In the preferred embodiment, three tray/heat exchanger modular units of substantially the same size and shape may be individually, removably mounted in vertically spaced relation to one another to the heat exchanger mounting frame. In a preferred embodiment, the removable mounting means comprises a plurality of longitudinally spaced openings formed through the side frame members of the mounting frame wherethrough a key-hook, pin, bolt, or similar mounting component on the tray may removably pass and be secured. It is preferred that mounting means such as a key-hook or pin be used which does not require any tools.

The number and arrangement of individual servers in a server rack may vary at any given time depending on the needs of the business. When racks are not fully loaded with servers there are empty shelves within the rack. Understanding that it is an inefficient use of energy to have heat exchangers located and operating at empty shelves, the present invention permits a technician to very quickly and optimally with no tools alternately mount and remove individual heat exchanger modules on the cooling door mounting frame such that the heat exchangers are positioned only at those locations where servers are located within the rack. In this regard, it will be appreciated that the technician may visually identify where to place the heat exchanger module on the mounting frame (i.e., directly in front of server-occupied rack shelves), and then align and pass the mounting components (e.g., key-hooks or pins) on the heat exchanger unit with and through the openings on the mounting frame that align with the desired identified location.

When the rack is full of servers, the maximum number of heat exchanger units or modules are mounted to the cooling door counting frame. Should certain racks lack a server, the heat exchanger adjacent those shelves may be removed from the mounting frame. In a preferred embodiment, the empty location on the mounting frame may be replaced with a closed tray (no fans and no openings thereon) or other closed panel (mounted in the same removable manner as the tray/heat exchanger unit) which acts to direct any warm air passing from the empty rack shelves to the next adjacent heat exchanger module. It will thus be appreciated that the present system allows the cooling door to be quickly and easily customized "on the fly" by the customer (with no special technician training needed) to accommodate intermittent changes in server numbers and locations within a rack to thereby minimize energy usage and maximize operating efficiencies. This modularity also makes maintenance or replacement of heat exchanger modular units quick to minimize downtime.

In yet a further embodiment of the invention, variations in rack heights may be accommodated by incorporating a movable shroud located at the top of the door cover which may be moved up or down on the door cover as needed. For example, the shroud may be moved to cover the top segment of the door cover to extend it to match the rack height. This allows one door design to transcend multiple rack heights and rack manufactures. Example: a design can allow mounting to 42 U through 44 U heights and accommodate variation between manufactures rack heights.

In a preferred embodiment, the heat exchangers are microchannel heat exchangers and refrigerant (e.g., R134A) is the coolant which travels through supply and return lines positioned above each row of server racks. Individual rack refrigerant supply and return lines are directed along the hinge side of the cooling doors and connect to a respective heat exchanger via quick connect swivel couplings. The refrigerant will flash to a gas at room temperature and there is thus no fear of damaging the servers should a leak occur in the supply or return lines as would be possible if the coolant used was water, for example, as is used in many prior art cooling systems.

A further benefit of having removable mounting of the heat exchanger modules to a separate door mounting frame is that the door cover, which includes the door handle, may be attached to the rack in either a right opening or left opening door orientation. The door cover and mounting frame (which have been previously connected together as explained above) may thus be first connected to the rack in either a left opening or right opening manner by simply rotating the door 180° as necessary to achieve the desired orientation. Once the door cover with mounting frame is attached to the rack, the desired number of tray/heat exchanger units are removably mounted to the mounting frame. The ability to removably mount the tray/heat exchanger units to the mounting frame is not dependent on which 180° orientation of the door cover and mounting frame is chosen. This is due to the configuration of the heat exchanger/mounting frame cooperative mounting components which, as stated above, are preferably in the form of a plurality of longitudinally spaced openings formed in each side frame member of the mounting frame and key-hooks extending from the tray/heat exchanger unit. The openings in the mounting frame are preferably the same configuration regardless of which 180° orientation is chosen for the door cover and mounting frame. Each tray/heat exchanger unit may thus be removably mounted to the mounting frame by passing the key-hooks through respective openings in the mounting frame side members. Once inserted and manually released, gravity secures and maintains the tray/heat exchanger unit on the mounting frame by virtue of the key-hook hanging within the respective opening.

Further operating efficiencies may be realized by electronically controlling the fans to turn on, off and/or change speeds in response to the sensed heat load at any given time or time intervals using temperature or other suitable sensors.

DESCRIPTION OF THE DRAWING FIGURES

The above-mentioned and other features and advantages of this invention, and the manner of attaining them, will become apparent and be better understood by reference to the following description of the invention in conjunction with the accompanying drawing, wherein:

FIG. 3A is an enlarged detail view of the circled segment "A" of FIG. 3;

FIG. 3B is an enlarged detail view of the circled segment "B" of FIG. 3;

DETAILED DESCRIPTION OF PREFERRED EMBODIMENTS

Figure 1:
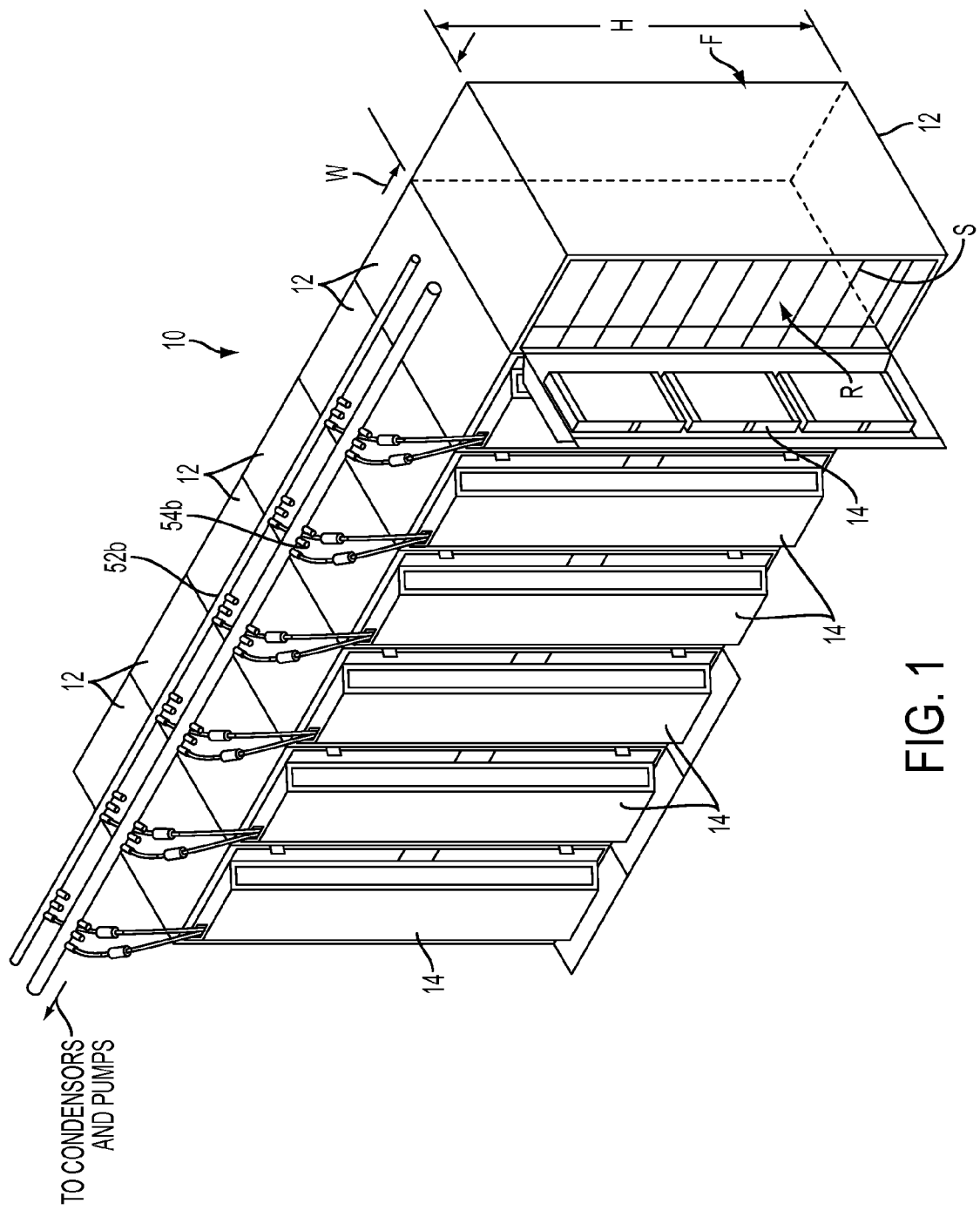
FIG. 1 is a perspective view showing an environment having a row of server racks with cooling doors mounted thereto in accordance with an embodiment of the invention.

Referring now to the drawing figures, there is seen in FIG. 1 a server rack and server room cooling system having a row 10 of server racks 12 which may be located in a dedicated server room (not shown). Although a single row of seven server racks 12 is shown in FIG. 1, it will be readily appreciated that the invention may be used to cool heated air rejected from any number of server racks placed in any arrangement.

It is seen that each server rack 12 generally comprises a tall, rectangular metal frame having vertically spaced shelves "S" with the rack being open at the front "F" and back or rear "R". A series of racks 12 are typically positioned in the side-by-side relation shown with multiple rows in spaced, parallel relation to one another. Very large server rooms can have hundreds if not thousands of server racks. The rack open front "F" provides access to the front of the servers (the servers themselves are not shown) while the open rear "R" provides access to the back of the servers. As explained above, server housings include openings allowing air to pass therethrough to assist with extracting heat from the server.

Figure 2:
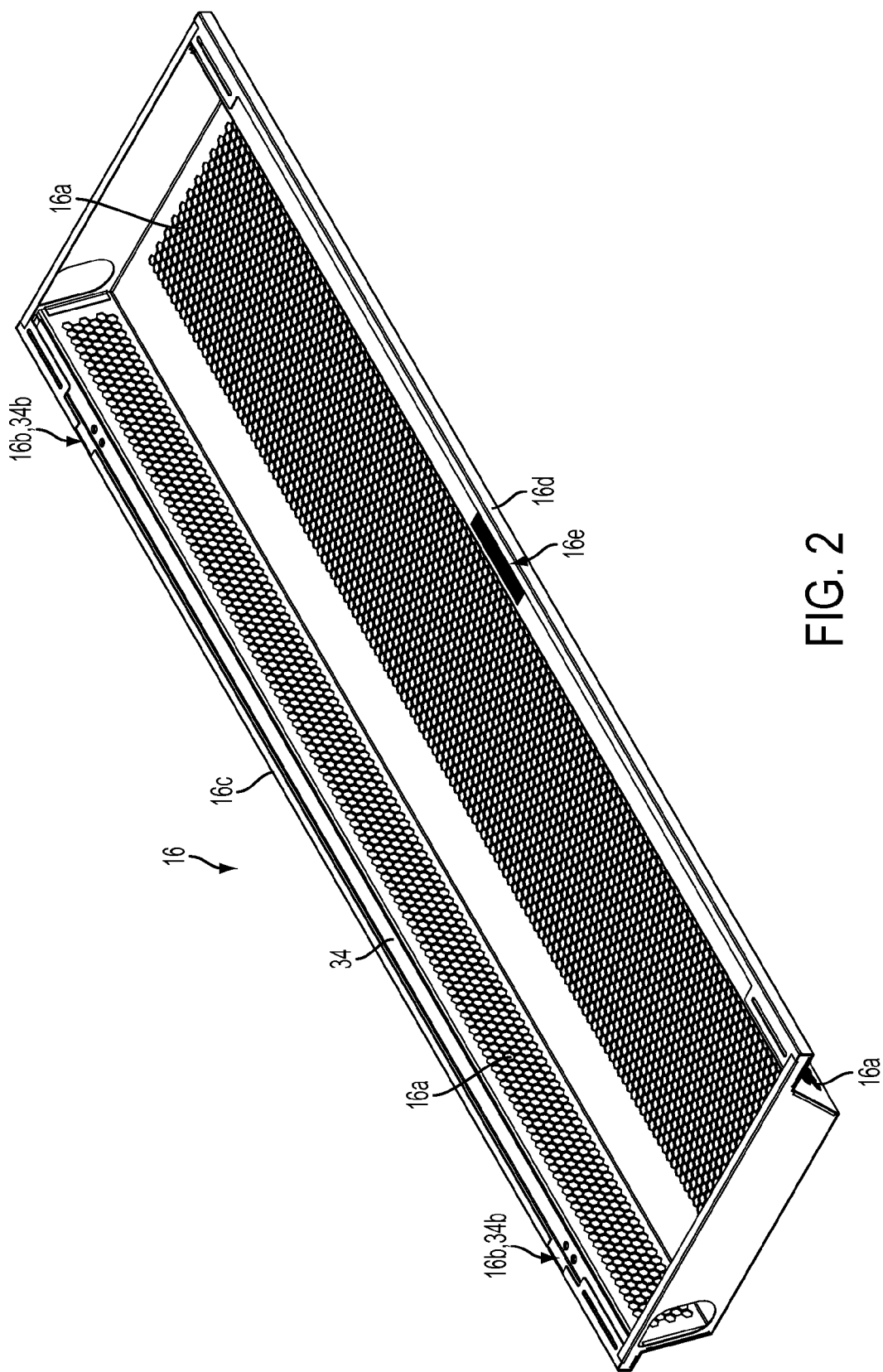
FIG. 2 is a perspective view of a door cover of the cooling door.
Figure 5B:
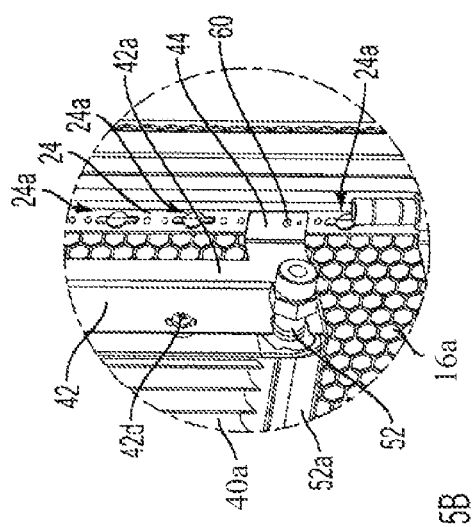
FIG. 5B is an enlarged detail view of the circled segment "B" of FIG. 3.
Figure 5A:
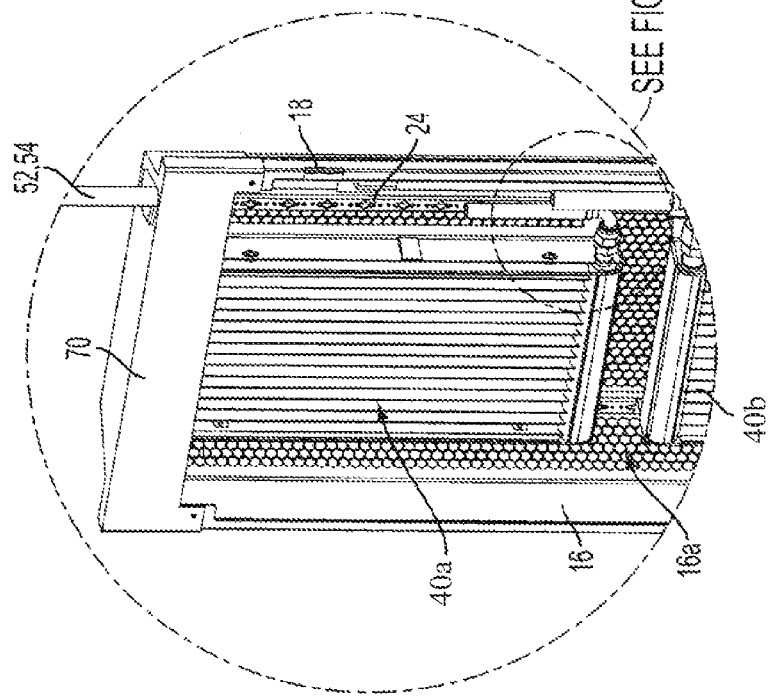
FIG. 5A is an enlarged detail view of the circled segment "A" of FIG. 5.

The present invention provides in a first aspect thereof a cooling door indicated generally at 14 adapted to be removably mounted to the rear opening "R" of a server rack 12. The cooling door 14 includes a protective cooling door cover 16 (FIG. 2) preferably formed of sheet metal and having screened surfaces 16a having a pattern of closely spaced openings allowing substantially unrestricted air flow therethrough. The door cover 16 is connected to the server rack 12 via one or more hinges 18 (FIGS. 5A and 5C) which may be secured at openings 16b formed adjacent side edge 16c of door cover 16 (FIG. 2). Opposite door cover side edge 16d includes an opening 16e for attachment of a handle 20. The hinged connection allows the cooling door 14 to pivot between the open position (server rack 12 at the right end of row 10 in FIG. 1), and the closed position (all other server racks 12 in row 10). In the open position, the server rack rear opening "R" is accessible to service or otherwise handle the servers on the rack shelves "S" as needed. In the closed position, the cooling door cover 16 extends across substantially the entire height "H" and width "W" of the rack rear opening "R".

Figure 3:
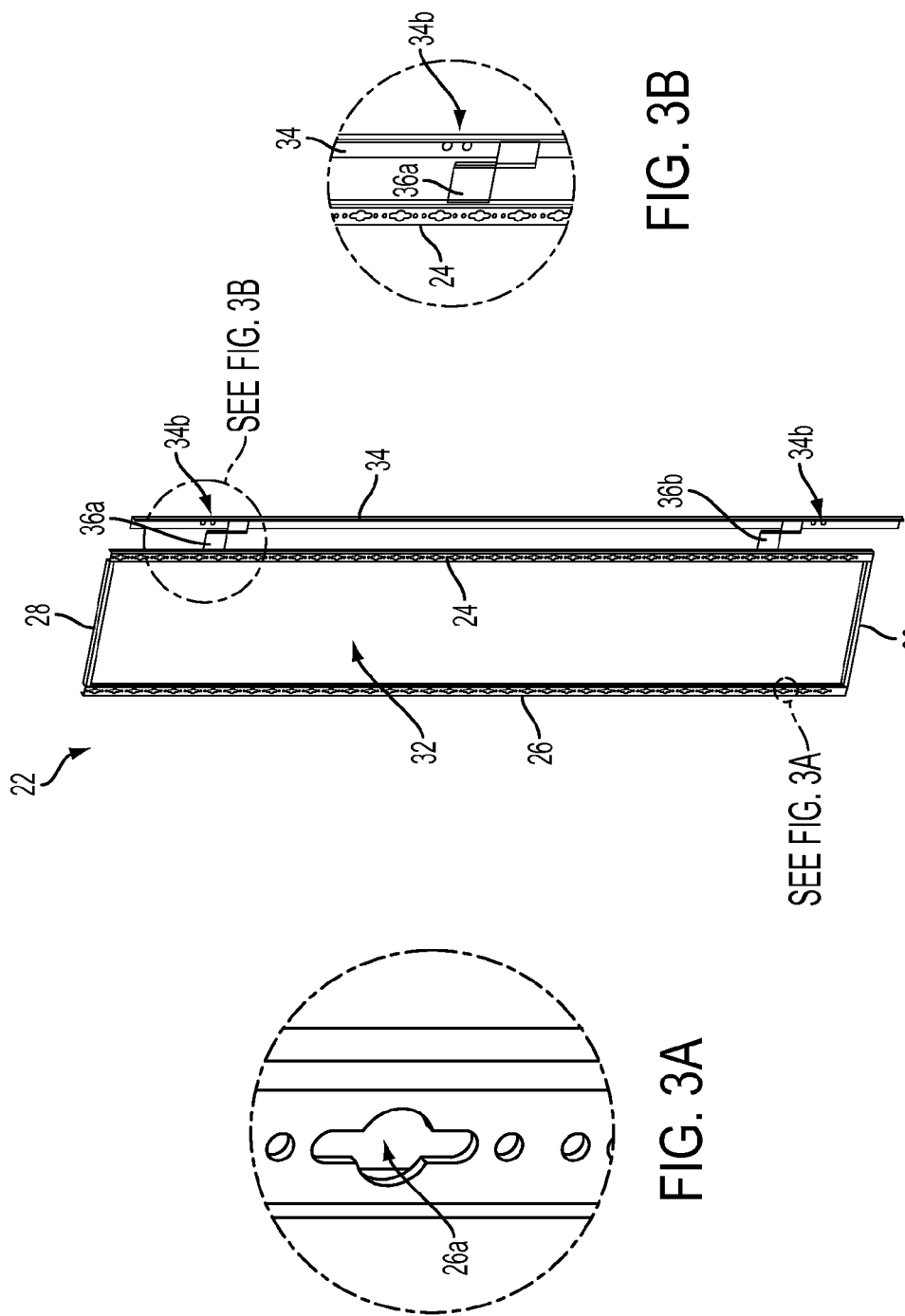
FIG. 3 is a perspective view of a mounting frame and hinge stiffening bar of the cooling door.

As seen best in FIG. 3, a rectangular heat exchanger mounting frame 22 is provided having first and second side frame members 24 and 26 with a top frame member 28 and bottom frame member 30 extending therebetween to define a rectangular opening 32. The heat exchanger mounting frame 22 is mounted inside the door cover 16 as will be explained below. In a preferred embodiment, the mounting frame 22 connects to the door cover 16 in the proximity of the door cover hinges 18 such that the loaded frame weight is not carried by the major surface area of the door cover 16 but rather is supported at or adjacent the location of the door hinge axis X-X. Separating the mounting frame 22 weight load from the major surface area of the door cover 16 minimizes physical load stress on the cooling door cover 16 which has beneficial effects such as reducing door cover wear and vibrations, for example. A separate hinge stiffening bar 34 may be provided to extend along the length of the hinged edge of the door cover 16 by aligning and passing screws through holes 16b and 34b. The mounting frame 22 may directly attach to stiffening bar 34 via angled brackets 36a and 36b (FIGS. 3 and 3B) which provides further cooling door strength and stability.

Figure 4:
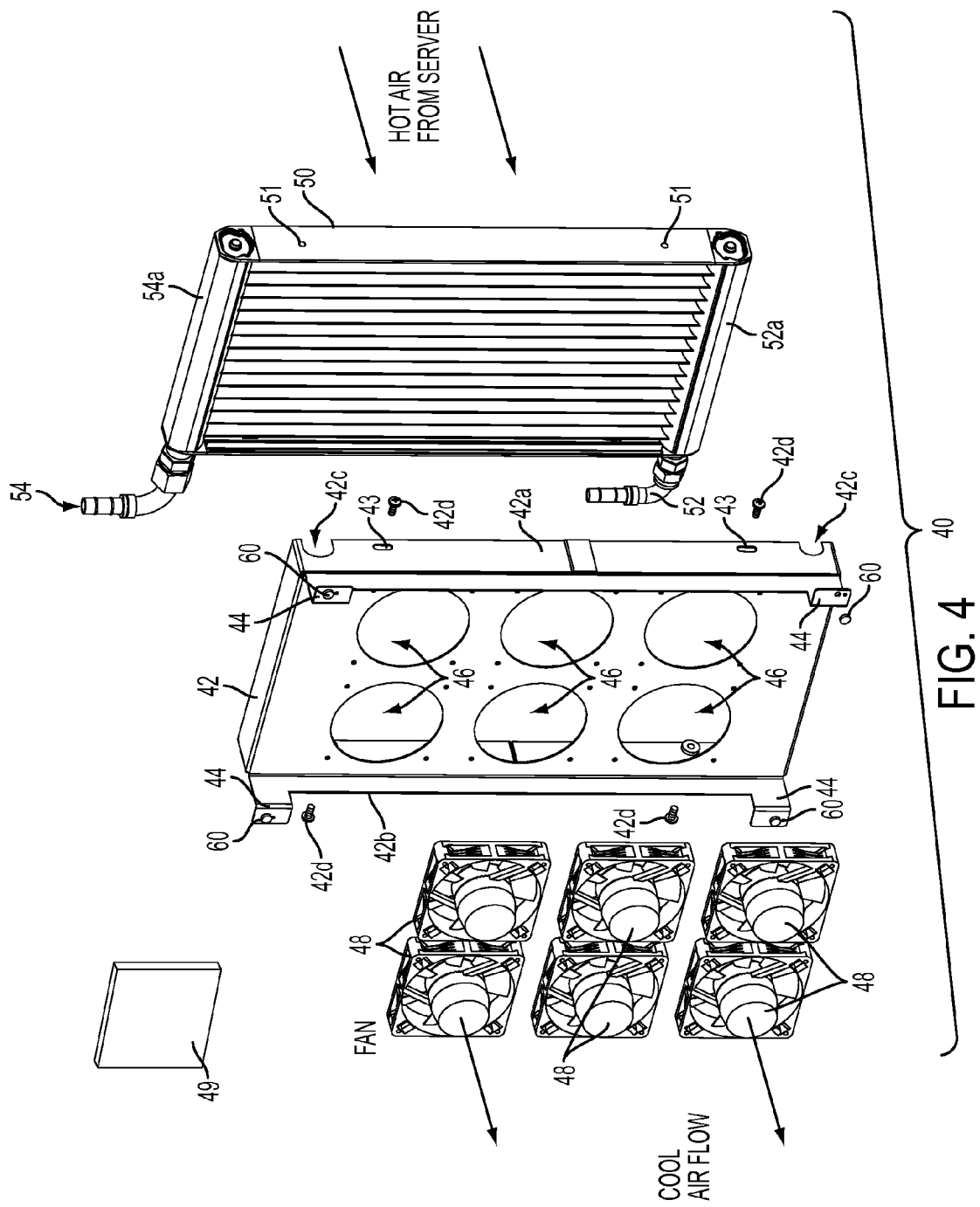
FIG. 4 is an exploded view of a heat exchanger modular unit according to a preferred embodiment of the invention.

As seen in FIG. 4, at least one heat exchanger modular unit 40 is provided for removable attachment to the heat exchanger mounting frame 22. In a preferred embodiment, each heat exchanger module 40 is first mounted to a respective tray 42 which in turn is mounted to the heat exchanger mounting frame 22 via brackets 44.

A heat exchanger 50, preferably an aluminum micro-channel heat exchanger coil, having supply and return lines 52 and 54, respectively, is mounted to tray 42 via any suitable mounting components. For example, tray 42 is seen to include side walls 42a and 42b having notches 42c wherein heat exchanger supply and return headers 52a, 54a may fit, respectively, with screws 42d passing through aligned holes 43,51 in the tray side walls and heat exchanger, respectively.

Tray 42 is seen to include an array of fan openings 46 in which a respective fan 48 or, if no fan is required at a particular tray opening location 46 due to the absence of a server at that location, a cover 49 may be removably mounted. The fans 48 operate to help draw and direct air from the servers in the rack 12 through the heat exchanger 50 to cool the air, and then direct the cooled air through the openings 16a in the door cover 16 and into the server room.

Figure 5:
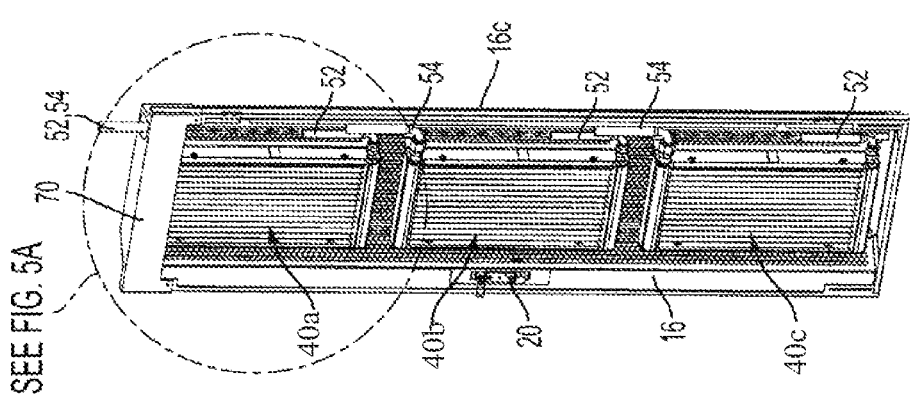
FIG. 5 is a perspective view of a cooling door showing the heat exchanger side thereof which would face the rear of the rack to which is mounts.
Figure 5C:
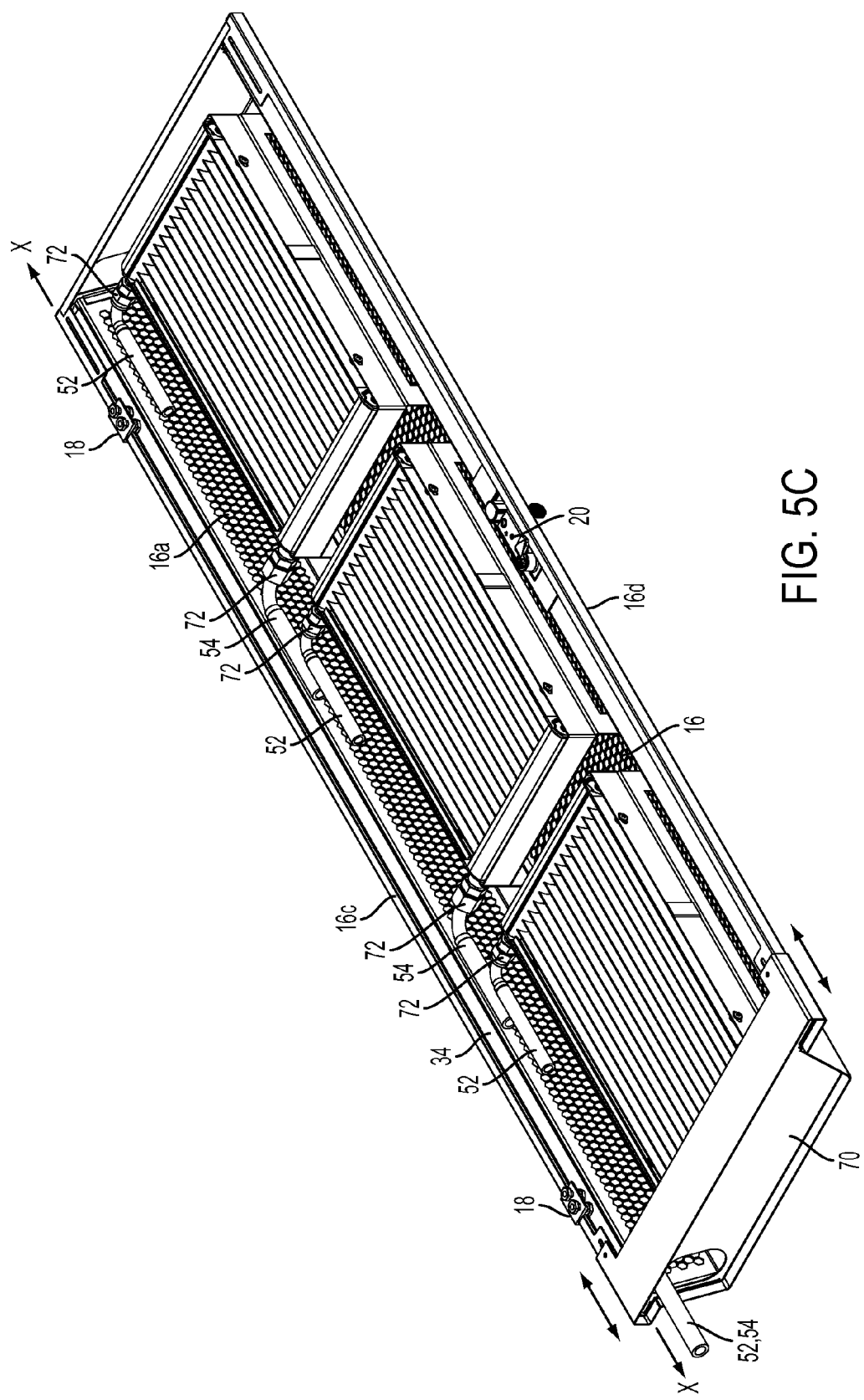
FIG. 5C is an enlarged perspective view of FIG. 5.
Figure 6:
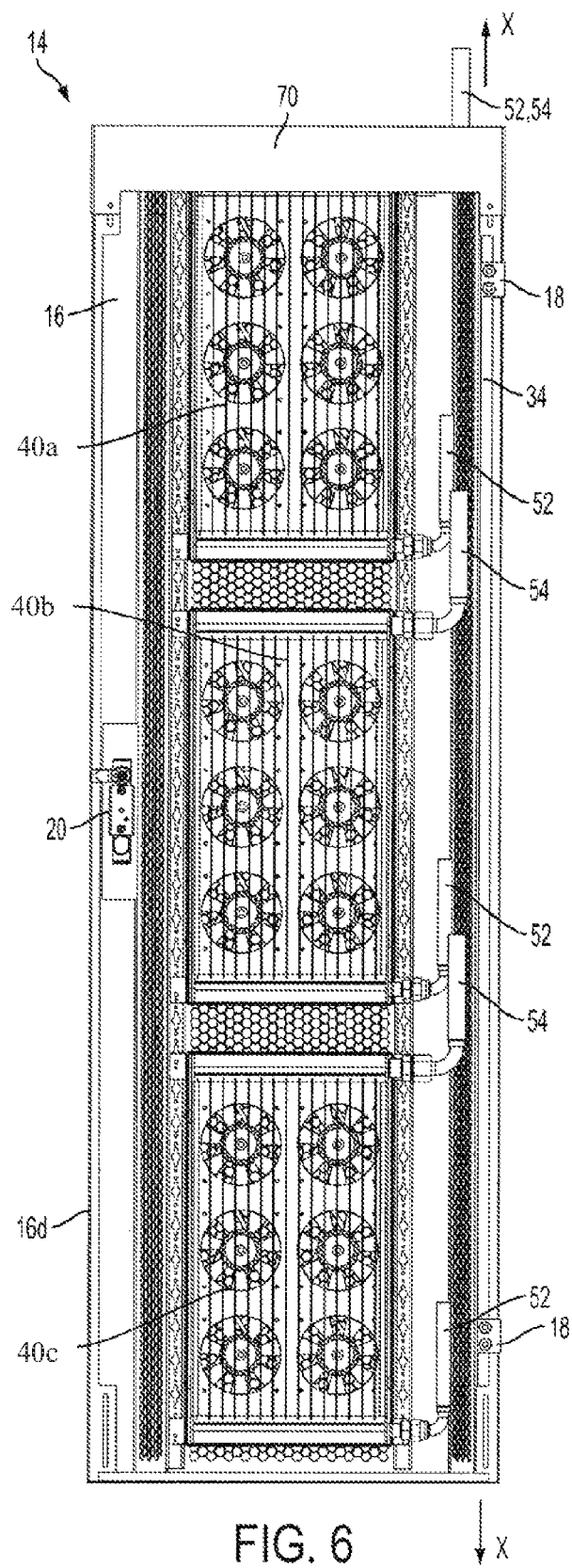
FIG. 6 is an elevational view of the heat exchanger side of the cooling door.
Figure 7:
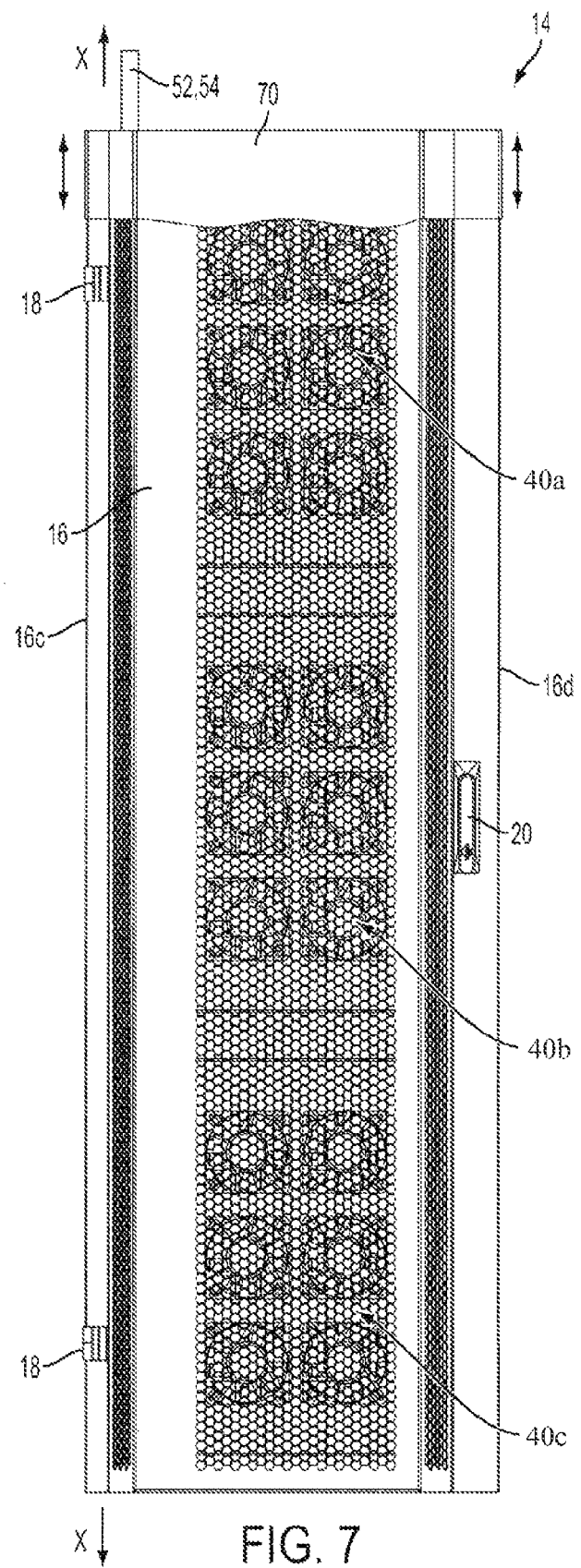
FIG. 7 is an elevational view of the door cover side of the cooling door.

Referring now also to FIGS. 5-7, in the preferred embodiment, at least three heat exchanger modular units 40a, 40b and 40c of substantially the same size and shape may be individually, removably mounted in vertically spaced relation to one another to the heat exchanger mounting frame 22. In a preferred embodiment, the removable mounting means comprises a plurality of longitudinally spaced openings 24a, 26a formed through respective side frame members 24 and 26 of the mounting frame 22 wherethrough the head of a key-hook 60 (FIG. 4, 5B) or other suitable mounting component on the tray 42 may removably pass and be secured. It is preferred that mounting means such as a key-hook head be used which may removably engage the respective opening 24a, 26a without requiring any tools.

The number and arrangement of individual servers in a server rack 12 may vary at any given time depending on the needs of the business. When racks are not fully loaded with servers there are empty shelves "S" within the rack. Understanding that it is an inefficient use of energy to have heat exchangers located and operating at empty shelves, the present invention permits a technician to very quickly and optimally with no tools mount or remove individual heat exchanger modular units 40a, 40b and 40c on the cooling door mounting frame 22 such that the heat exchanger modular units are positioned only (or mostly only) at those locations where servers are located within the rack 12. In this regard, it will be appreciated that the technician may visually identify where to place the heat exchanger modular unit 40 on the mounting frame 22 (i.e., directly in front of server-occupied rack shelves), and then align and pass the mounting components (e.g., key-hooks 60) on the heat exchanger modular unit 40 with and through the selected openings 24a, 26a on the mounting frame 22 that align with the desired identified location.

When the rack is full of servers, the maximum number of heat exchanger modular units 40 are mounted to the cooling door counting frame 22. Should certain rack shelves "S" lack a respective server, the heat exchanger modular unit 40 adjacent those shelves may be removed from the mounting frame 22. In a preferred embodiment, the empty location on the mounting frame may be replaced with a completely closed tray (no fans and no openings thereon which may be removably covered with cover 49, for example, as explained above (or other closed panel mounted to frame 22 in the same or similar removable manner as the units 40) which acts to direct any warm air passing from the empty rack shelves to the next adjacent heat exchanger modular unit 40. In this regard, it is noted that any number, including zero, of fans may be utilized as desired, regardless of the presence of servers in the server racks. With no fans present and/or operating in the cooling door, the passage of warm air through the cooling door will emanate from the electronic equipment fans or other auxiliary fans placed in the proximity of the server racks. It will thus be appreciated that the present system allows the cooling door 14 to be quickly and easily customized "on the fly" by the customer (with no special technician training needed) to accommodate intermittent changes in server numbers and locations within a rack 12 to thereby minimize energy usage and maximize operating efficiencies.

In yet a further embodiment of the invention, variations in rack heights may be accommodated by incorporating a movable (e.g., freely slidable) shroud 70 located at the top of the door cover 16 which may be moved up or down on the door cover 16 as needed to accommodate different rack heights "H". For example, today's server racks come in heights typically varying from 42 U to 45 U. The cooling door height may be made to align with the tallest server rack of 45 U. In this instance, shroud 70 would be moved all the way up so as to be out of the way and not cover any significant part of the door cover 16. When using the same cooling door for a rack of a smaller height (e.g., 42 U), the shroud 70 may be moved downwardly to cover the top segment of the door cover 16 that extends above the shorter rack. In this way, air from the server room located above the shorter rack is blocked and not directed into the cooling door, thereby maintaining top operating efficiencies.

As stated above, in a preferred embodiment, the heat exchangers are micro-channel heat exchangers and refrigerant (e.g., R134A) is the coolant which travels through supply and return lines 52, 54 respectively, the main headers 52*b*, 54*b* for a server rack row 10 (FIG. 1) of which may be positioned above each row 10 of server racks 12. Individual rack refrigerant supply and return lines 52, 54 are directed along the hinge side 16*c* of the cooling doors (FIGS. 5-5C) and connect to a respective heat exchanger modular unit 40*a*, 40*b*, 40*c* via quick connect swivel couplings 72. The refrigerant will flash to a gas at room temperature and there is thus no fear of damaging the servers should a leak occur in the supply or return lines 52, 54 as would be possible if the coolant used was water, for example, as is used in many prior art cooling systems.

A further benefit of having removable mounting of the heat exchanger module units 40*a*, 40*b* and 40*c* to a separate door mounting frame 22 is that the door cover 16, which includes the door handle 20, may be attached to the rack in either a right opening or left opening door orientation. The door cover 16 and mounting frame 22 (which have been previously connected together as explained above) may thus be first connected to a respective rack 12 in either a left opening or right opening manner by simply rotating the door 180° as necessary to achieve the desired orientation. Once the door cover 16 with mounting frame 22 is attached to the rack 14, the desired number of heat exchanger modular units 40 are removably mounted to the mounting frame 22 as explained above. The ability to removably mount the heat exchanger modular units 40*a*, 40*b*, 40*c* to the mounting frame 22 is not dependent on which 180° orientation of the door cover and mounting frame is chosen. This is due to the configuration of the heat exchanger/mounting frame cooperative mounting components which, as stated above, are preferably in the form of a plurality of longitudinally spaced openings 24*a*, 26*a* formed in each side frame member 24, 26 of the mounting frame 22 and key-hooks 60, for example, extending from the heat exchanger modular unit 40. The openings 24*a*, 26*a* in the mounting frame 22 are preferably the same symmetrical configuration regardless of which 180° orientation is chosen for the door cover and mounting frame. Each heat exchanger modular unit 40*a*, 40*b*, 40*c* may thus be removably mounted to the mounting frame 22 by passing the key-hooks 60 through respective openings 24*a*, 26*a* in the mounting frame side members 24, 26. Once inserted and manually released, gravity secures and maintains the heat exchanger modular units 40*a*, 40*b*, 40*c* on the mounting frame 22 by virtue of the key-hook 60 or other like element frictionally engaging the respective opening.

Further operating efficiencies may be realized by electronically controlling the fans to turn on, off and/or change speeds in response to the sensed heat load at any given time or time intervals using temperature or other suitable sensors.

While this method and apparatus has been shown and described with reference to certain preferred embodiments thereof, it will be understood by those skilled in the art that various changes in form and details may be made therein without departing from the spirit and scope of the invention as described.

What is claimed is:

1. A cooling door for cooling rejected heat from a rack containing electronic equipment, said cooling door comprising:
   a) two or more heat exchanger modules, each of said modules each having a heat exchanger with each said heat exchanger including a supply header and a return header adapted to circulate cooling fluid therethrough by cooling fluid entering a said heat exchanger from a respective said supply header and exiting said heat exchanger through a respective said return header;
   b) each of said heat exchangers having a respective supply line and a return line releasably connected at first ends thereof to a respective heat exchanger supply header and return header via first and second quick connect couplings located on a respective said supply header and said return header, respectively, said supply lines and said return lines of each heat exchanger extending therefrom and outwardly from said door and adapted to connect at second, opposite ends thereof to a main supply header and a main return header located externally of the rack;
   c) a heat exchanger mounting frame having first and second side frame members including a plurality of longitudinally spaced openings formed therethrough and wherein said heat exchanger mounting frame is adapted to removably support said two or more heat exchanger modules in vertically spaced relation thereon; and
   d) one or more mounting components affixed to each of said two or more heat exchanger modules, each of said one or more mounting components configured for toolless removable attachment to a preselected and respective one of said mounting frame openings such that each of said two or more heat exchanger modules is independently mountable to and removable from said heat exchanger mounting frame by disconnecting said first and second quick connect couplings located at the heat exchanger to be removed such that each heat exchanger may be individually and selectively removed from or mounted onto said mounting frame without interrupting the circulation of cooling fluid through the supply and return lines connected to all other heat exchanger modules mounted in said door.

2. The cooling door of claim 1, wherein said mounting frame openings are configured to allow said one or more mounting components to be removably attached thereto regardless of whether said cooling door is rotated 180° about a horizontal axis with respect to the rack.

3. The cooling door of claim 2 wherein said openings are symmetrically shaped about a vertical axis extending parallel to the longitudinal axis of said cooling door.

4. The cooling door of claim 3 wherein said one or more mounting components are in the form of key-hooks operable to freely pass through a respective mounting frame opening and upon release be secured thereto via gravity.

5. The cooling door of claim 1 wherein said heat exchanger comprises a microchannel heat exchanger mounted to a tray having a plurality of tray openings formed therethrough, said mounting components affixed to said tray with said tray being removably mounted to said mounting frame openings via said mounting components.

6. The cooling door of claim 5 wherein each of said two or more heat exchanger modules further comprises at least one fan removably mounted at the location of a preselected one of said plurality of tray openings.

7. The cooling door of claim 6 and further comprising a door cover attached to said mounting frame on the side of said tray opposite said heat exchanger.

8. The cooling door of claim 7 wherein said door cover includes a pair of door hinges and said mounting frame attaches to said door at a location adjacent said pair of hinges.

9. The cooling door of claim 8 wherein said door cover may be mounted to said rack via said pair of hinges whereby said cooling door is movable between open and closed positions with respect to said rack.

10. The cooling door of claim 6 and further comprising one or more removable covers adapted to be removably positioned over and close each of said plurality of tray openings not selected as said preselected tray opening.

11. The cooling door of claim 6 wherein said heat exchanger includes refrigerant headers extending therefrom, and wherein said tray includes one or more notches configured for removable connection to said refrigerant headers.

12. The cooling door of claim 1 and further comprising a shroud slidably attached to said door and selectively movable to adjust the height of said door.

* * * * *